US010855058B2

(12) United States Patent
Stifanic et al.

(10) Patent No.: US 10,855,058 B2
(45) Date of Patent: Dec. 1, 2020

(54) METHOD FOR TESTING A SEMICONDUCTOR SPARK PLUG

(71) Applicant: SAFRAN AIRCRAFT ENGINES, Paris (FR)

(72) Inventors: David Gino Stifanic, Moissy-Cramayel (FR); Joël Yvan Marcel Robert Berton, Moissy-Cramayel (FR); Denis Robert Gaston Haussaire, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 60 days.

(21) Appl. No.: 16/337,514

(22) PCT Filed: Sep. 27, 2017

(86) PCT No.: PCT/FR2017/052596
§ 371 (c)(1),
(2) Date: Mar. 28, 2019

(87) PCT Pub. No.: WO2018/060592
PCT Pub. Date: Apr. 5, 2018

(65) Prior Publication Data
US 2019/0229502 A1 Jul. 25, 2019

(30) Foreign Application Priority Data
Sep. 30, 2016 (FR) ..................................... 16 59424

(51) Int. Cl.
*G01R 13/42* (2006.01)
*H01T 13/60* (2011.01)
(Continued)

(52) U.S. Cl.
CPC ............. *H01T 13/60* (2013.01); *H01T 13/52* (2013.01); *H01T 13/58* (2013.01); *H01T 13/38* (2013.01)

(58) Field of Classification Search
CPC ........ G01R 13/42; G01R 31/50; H01T 13/58; H01T 15/00; H01T 13/60; H01T 13/52; H01T 13/38
See application file for complete search history.

(56) References Cited

U.S. PATENT DOCUMENTS 3,238,447 A * 3/1966 Bychinsky .............. H01T 13/58 324/394
3,376,367 A 4/1968 Subramanya et al.
(Continued)

FOREIGN PATENT DOCUMENTS

FR 2960913 A1 12/2011

OTHER PUBLICATIONS

Search Report issued in French Patent Application No. 16 59424 dated Jun. 9, 2017.
(Continued)

*Primary Examiner* — Jermele M Hollington
*Assistant Examiner* — Taqi R Nasir
(74) *Attorney, Agent, or Firm* — Pearne & Gordon LLP

(57) ABSTRACT

In order to test a semiconductor spark plug, a test method comprises a step consisting of depositing water on the head of the spark plug, between the two electrodes of same, so that the water forms a water meniscus covering the semi-conductor element of the head, a step consisting of applying, between the first terminal and the second terminal of the spark plug, a voltage equal to the operating voltage of the spark plug, a step consisting of identifying at least a first characteristic of electric arcs induced between the electrodes during the application of the voltage, and a step consisting
(Continued)

of determining the operational or defective character of the spark plug according to the first characteristic of the electric arcs. This test method is particularly reliable and does not require constraining provisions in order to ensure the safety of the operators implementing the method.

7 Claims, 2 Drawing Sheets

(51) Int. Cl.

*H01T 13/52* (2006.01)
*H01T 13/58* (2020.01)
*H01T 13/38* (2006.01)

(56) References Cited

U.S. PATENT DOCUMENTS

| | | | | |
|---|---|---|---|---|
| 9,170,175 | B2 | 10/2015 | Chatenet et al. | |
| 10,109,985 | B2 | 10/2018 | Berton et al. | |
| 2008/0315895 | A1* | 12/2008 | Honda | H01T 13/60 324/557 |
| 2010/0141110 | A1* | 6/2010 | Nakamura | H01T 13/20 313/143 |
| 2011/0156716 | A1* | 6/2011 | Tober | H02S 50/10 324/501 |
| 2016/0223604 | A1* | 8/2016 | Hirose | G01R 31/1263 |

OTHER PUBLICATIONS

International Search Report issued in Application No. PCT/FR2017/052596 dated Dec. 4, 2017.

Written Opinion issued in Application No. PCT/FR2017/052596 dated Dec. 4, 2017.

* cited by examiner

METHOD FOR TESTING A SEMICONDUCTOR SPARK PLUG

This is the National Stage application of PCT international application PCT/FR2017/052596, filed on Sep. 27, 2017 entitled "METHOD FOR TESTING A SEMICONDUCTOR SAPRK PLUG", which claims the priority of French Patent Application No. 16 59424 filed Sep. 30, 2016, both of which are incorporated herein by reference in their entirety.

TECHNICAL DOMAIN

This invention relates to the domain of spark plugs installed on turbomachines used for the propulsion of aircrafts.

The invention relates particularly to a method designed for testing such a spark plug.

STATE OF PRIOR ART

Semiconductor spark plugs are widely used to initiate combustion of the air and fuel mix inside combustion chambers of aircraft turbomachines.

These are plugs comprising a central electrode, a ground electrode surrounding the central electrode, and an annular shaped semiconducting element interposed between the two electrodes. The ground electrode is electrically and physically in contact with this semiconducting element although there is a small air gap of a few tenths of a millimetre between the central electrode and the semiconducting element.

When a sufficient voltage is applied between the two electrodes, air present in the air gap becomes ionised and thus contributes to the formation of an electric arc between the two electrodes. Due to the surface polarisation of the semiconductor, the arc "sticks" to the semiconductor independently of the surrounding pressure.

Spark plugs of this type thus have the advantage that they can be powered at relatively low voltages, typically of the order of 3 kV. The voltage required to supply power to such a plug is also independent of the internal pressure in the combustion chamber.

When a starting failure occurs with an aircraft turbomachine fitted with such spark plug, the spark plug is removed to be replaced.

However, for economic reasons, it is desirable to have a reliable method of determining the operational or defective nature of such a spark plug with a low error ratio, so as to avoid scrapping plugs that are still serviceable while avoiding putting defective plugs back into service.

PRESENTATION OF THE INVENTION

The main purpose of the invention is to provide a simple, economic and efficient solution to this problem.

To achieve this, it discloses a method for testing a semiconductor spark plug comprising two terminals and a head comprising two electrodes each connected to one of the two terminals and separated from each other by a semiconducting element, the method comprising:

- a step consisting of depositing water on the head between the two electrodes, such that the water forms a meniscus covering the semiconducting element,
- a step consisting of applying an electric voltage equal to an operating voltage of the spark plug between the first terminal and the second terminal,
- a step consisting of identifying at least one characteristic of electric arcs induced between the electrodes when the electric voltage is applied, and
- a step consisting of determining the nature of the spark plug (operational or defective) depending on the characteristic of electric arcs.

The disclosed method thus consists of making the spark plug spark in the presence of a small quantity of water on its head. After intense search, the inventors observed that such a test is particularly efficient for discriminating between plugs that are still functional and plugs that are defective. Furthermore, the use of water in the disclosed test method has the advantage that it does not require any special precautions to guarantee the safety of operators and to avoid causing any pollution of the environment.

In one preferred embodiment of the invention, the first characteristic is the number of electric arcs observed during a predetermined time period during which the electric voltage is applied.

As a variant, the first characteristic can be the dispersion or absence of dispersion of the water meniscus at the end of a predetermined duration.

As another variant, the above two types of characteristics can be identified cumulatively and used to determine the nature of the spark plug (operative or defective).

The step consisting of applying an electric voltage between the first terminal and the second terminal is preferably implemented by means of a turbomachine ignition box.

In the preferred embodiment of the invention, the test method includes a preliminary test method implemented before the step in which water is deposited on the head of the spark plug, and consisting of:

- applying an electric voltage between the first terminal and the second terminal equal to the operating voltage of the spark plug, the semiconducting element being exposed to air,
- identifying at least one characteristic of electric arcs induced between the electrodes when the electric voltage is applied, and continuing or stopping the test method depending on the characteristic of electric arcs.

The preliminary test step can detect the most defective spark plugs and avoid the use of later steps in the test method for these plugs.

The second characteristic is preferably the number of electric arcs observed during a predetermined time period during which the electric voltage is applied.

One particularly advantageous application of the test method according to the invention is testing of used spark plugs, but this method can also be used to test new spark plugs, for example at the outlet from the manufacturing line.

BRIEF DESCRIPTION OF THE DRAWINGS

The invention will be better understood and other details, advantages and characteristics will become clear after reading the following description given as a non-limitative example with reference to the appended drawings among which.

In all these figures, identical references can designate identical or similar elements.

DETAILED PRESENTATION OF PREFERRED EMBODIMENTS

Figure 1:
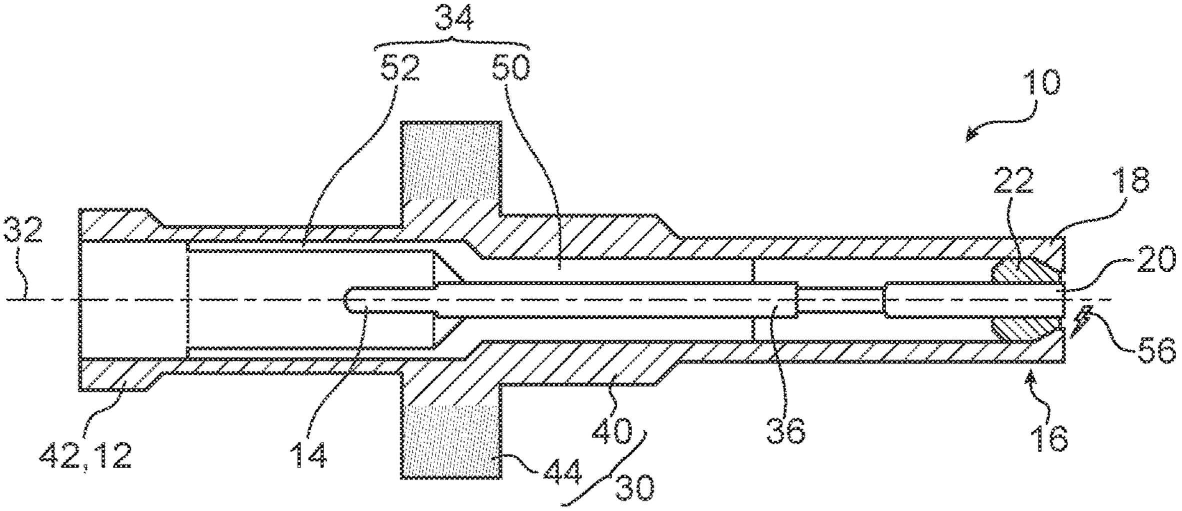
FIG. 1 is an axial diagrammatic sectional view of a semiconductor spark plug.

FIG. 1 illustrates a known type of semiconductor spark plug 10 comprising in general two terminals 12, 14, and a head 16 comprising two electrodes 18, 20 connected to two terminals 12, 14 respectively and separated from each other by a semiconducting element 22, for example of the semiconducting ceramic type.

More precisely, the spark plug comprises a hollow external body 30 extending along an axis 32, a hollow intermediate body 34 extending along the axis 32 inside the external body 30, and an internal body 36 generally in the form of a stem extending along the axis 32, inside the intermediate body 34. Furthermore, the semiconducting element 22 extends along the prolongation of the intermediate body 34 and in contact with it, inside the external body 30 and around the internal body 36.

The external body 30 comprises a globally cylindrical part 40 with a first end forming one of the electrodes 18 called the "ground electrode", a second end 42 forming one of the terminals 12 that is thus connected to the ground electrode 18, and an annular plate 44 for supporting the plug. As a variant, other types of plugs can be provided with a thread or any other means of fixing the plug in an engine. Furthermore, the terminal 12 delimits the exterior of the input of a spark plug connector.

The internal body 36 has a first end forming the other electrode 20, called the "central electrode" that is surrounded at a distance by the ground electrode 18, and a second opposite end forming the other terminal 14, that is thus connected to the central electrode 20.

The intermediate body 34 comprises a part 50 in contact with the internal body 36, and a part 52 arranged axially direction level with and beyond the terminal 14 formed by the internal body 36, and with a broadened inside diameter so as to form a space between this part 52 and the terminal 14 and thus to delimit the exterior of a bottom part of the spark plug connector.

The external body 30 and the internal body 36 are made from an electricity conducting material capable of operating at high temperatures, such as a nickel-based superalloy with low creep at high temperature. The intermediate body 34 is made from an electrically insulating material of ceramic type to guarantee isolation between the electrodes 18 and 20.

As explained above, when a sufficiently high voltage is applied across terminals 12 and 14 of such a spark plug inside a turbomachine combustion chamber, a weak electric current passes through the semiconducting element 22 and is conducive to ionisation of the air and fuel mix close to the plug and is thus conducive to the formation of electric arcs 56 between the two electrodes 18 and 20.

During operation, it is generally desirable to obtain a series of such electric arcs. Consequently, a discontinuous or variable voltage is applied across terminals 12 and 14 of the plug so as to intermittently apply a sufficiently high voltage across said terminals to trigger an electric discharge.

When a start up problem has been detected on a turbomachine in operation, the spark plug(s) installed on the turbomachine is (are) removed.

This invention provides a reliable test method to determine whether or not such a used spark plug 10 is still operational or on the contrary if the spark plug should be scrapped.

Figure 2:
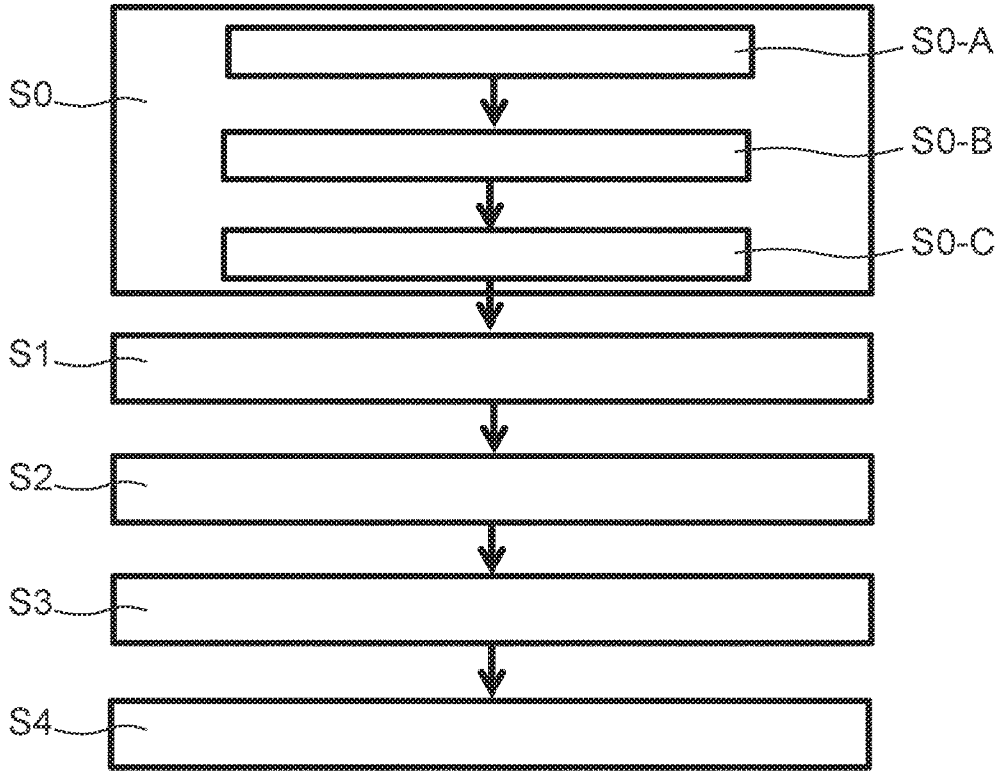
FIG. 2 is a diagram of a test method applicable to the spark plug in FIG. 1 in accordance with a preferred embodiment of the invention.
Figure 3:
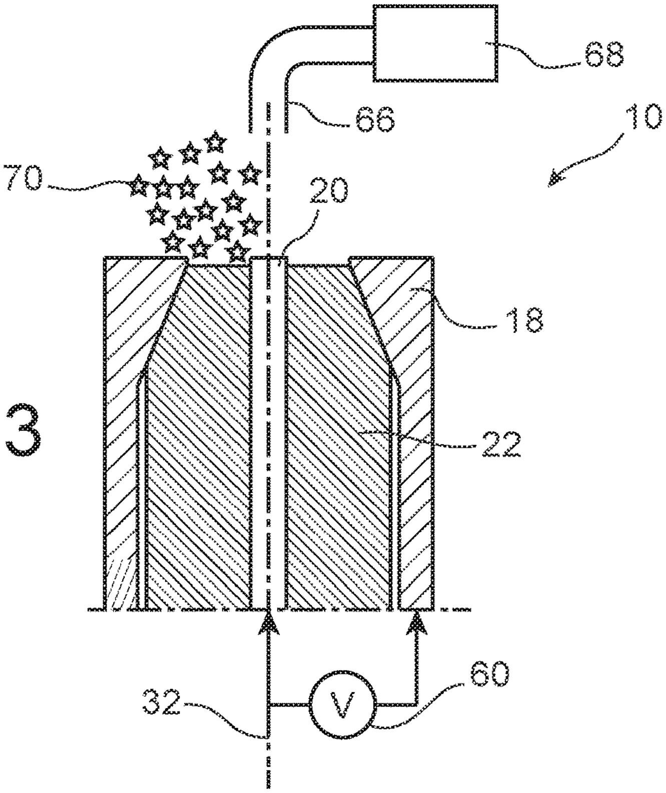
FIGS. 3-5 illustrate a spark plug head during the different steps of the method in FIG. 2.
Figure 4:
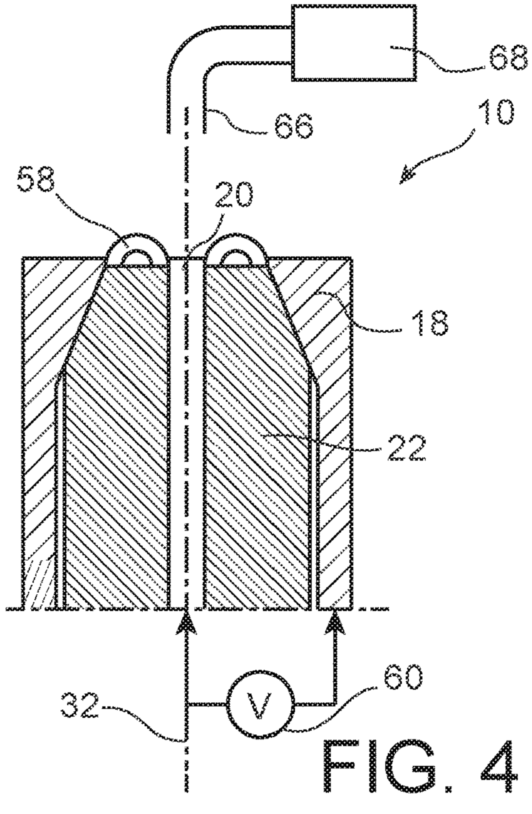

In particular, the test method according to the invention comprises:

- a step S1 consisting of depositing water on the plug head 16 between the two electrodes 18 and 20, such that the water forms a meniscus 58 covering the semiconducting element (FIGS. 2 and 4),
- a step S2 consisting of applying an electric voltage between the first terminal 12 and the second terminal 14 equal to an operating voltage of the spark plug 10, for example using an ignition box 60 of the turbomachine (illustrated very diagrammatically on FIGS. 3-5),
- a step S3 consisting of identifying at least a first characteristic of the electric arcs 62 induced between the electrodes 18, 20 when the electric voltage is applied (FIGS. 2 and 5), and
- a step S4 consisting of determining the nature of the spark plug 10 (operational or defective) depending on the first characteristic of the electric arcs 62.

The amplitude of the functioning voltage of the spark plug 10 is typically equal to 3 kV.

Water can be in the liquid state or the frozen state at the time that step S2 is implemented, depending on operating conditions to be simulated. Therefore in the case of frozen water, the spark plug mounted above the water meniscus is under conditions such that water can freeze before step S2 is implemented.

In all cases, water can be deposited on the head 16 of the plug in step S1 either manually by an operator, or using a device controlled or automated for this purpose.

In the preferred embodiment of the invention, the above-mentioned first characteristic is the number of electric arcs 62 observed during a predetermined time period. Step S4 then consists of comparing this number with a theoretical number calculated as a function of the frequency of the voltage applied across terminals 12, 14 of the plug and the duration of the time period considered.

Furthermore, the comparison between the number of observed electric arcs 62 and the theoretical number preferably simply consists of checking that there are no failed electric arcs during the predetermined time period.

Figure 5:
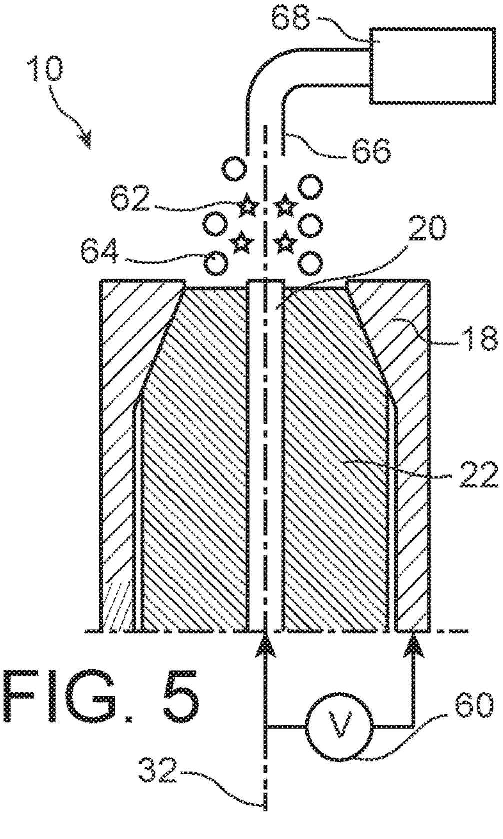

For an operational spark plug, it should be noted that the power of the electric arcs 62 is sufficient to disperse the water meniscus 58 in the first seconds during which the electric voltage is applied (as shown diagrammatically by the water droplets 64 on FIG. 5). On the other hand, this power is generally not sufficient to disperse the water meniscus 58 for a tested ignition plug that is not suitable for service.

In this respect, as a variant, the first characteristic of the electric arcs 62 identified during step S3 mentioned above can be the dispersion or absence of dispersion of the water meniscus 58 at the end of a predetermined duration.

Furthermore, the water quantity deposited on the semiconducting element 22 typically represents the volume of two to three drops, and more generally is less than 1 $cm^3$. For example, water can be deposited by means of a pipette, or by dipping the plug head 16 in a receptacle containing water.

For example, electric arcs 62 can be counted using an optical fibre 66 located a few centimetres from the electrodes 18 and 20 along the axis 32 of the spark plug 10, and an electronic box 68 converting light produced by the electric arcs into electrical pulses and counting the pulses.

In the preferred embodiment of the invention, the test method comprises a preliminary test step S0 (FIGS. 2 and 3) implemented before step S1 consisting of placing water on the head 16. This preliminary step S0 consists of:

applying an electric voltage between the first terminal 12 and the second terminal 14 equal to the operating voltage of the spark plug 10, the semiconducting element 22 being exposed to air (sub-step S0-A), identify at least one second characteristic of electric arcs 70 induced between the electrodes 18, 20 when the electric voltage is applied (sub-step S0-B), and continue or stop the test method depending on the characteristic of electric arcs 70 (sub-step S0-C).

Thus, if the second characteristic of the electric arcs 70 is different from an expected characteristic, the test method is terminated and the ignition plug is deemed to be defective. On the other hand, if the second characteristic of the electric arcs 70 complies with the expected characteristic, the test method continues with steps S1 to S4.

The second characteristic of electric arcs 70 identified during the preliminary test step S0 is preferably of the same type as the first characteristic of the electric arcs 62 identified during step S3. In this case, the preliminary test step S0 is similar to the chaining of steps S1-S4, except that the semiconducting element is exposed to air in the preliminary test step S0.

Therefore the preliminary test step S0 provides a simple and fast means of detecting the most defective spark plugs and avoiding the use of later steps in the test method for these plugs. On the other hand, subsequent steps S1-S4 enable a finer discrimination between operational spark plugs and defective spark plugs, this optimising the reliability of the test method.

Furthermore, the use of water in step S1 has the advantage that it does not require any restrictive measures to guarantee the safety of operators implementing it.

It should be noted that the test method described above in its application to used spark plugs, can also be used in the validation of unused spark plugs before they are sold, in other words before they are used for the first time.

What is claimed is:

1. A method for testing a semiconductor spark plug (10) comprising two terminals (12, 14) and a head (16) comprising two electrodes (18, 20) each connected to one of the two terminals and separated from each other by a semiconducting element (22), the method comprising:

a step (S1) consisting of depositing water on the head (16) between the two electrodes (18, 20), such that the water forms a water meniscus (58) covering the semiconducting element (22), a step (S2) consisting of applying an electric voltage equal to an operating voltage of the spark plug (10) between the first terminal (12) and the second terminal (14), a step (S3) consisting of identifying at least a first characteristic of the electric arcs (62) induced between the electrodes (18, 20) when the electric voltage is applied, and a step (S4) consisting of determining the operational or defective nature of the spark plug (10) depending on the first characteristic of the electric arcs (62).

2. The method according to claim 1, wherein the first characteristic is the number of electric arcs (62) observed during a predetermined time period during which the electric voltage is applied.

3. The method according to claim 1, wherein the first characteristic is the dispersion or absence of dispersion of the water meniscus (58) at the end of a predetermined duration.

4. The method according to claim 1, wherein the step (S2) consisting of applying an electric voltage between the first terminal (12) and the second terminal (14) is preferably implemented by means of a turbomachine ignition box (68).

5. The method according to claim 1 4, comprising a preliminary test step (S0) implemented before the step (S1) consisting of depositing water on the head (16), and consisting of:

applying an electric voltage between the first terminal (12) and the second terminal (14) equal to the operating voltage of the spark plug (10), the semiconducting element (22) being exposed to air, identifying at least one second characteristic of electric arcs (70) induced between the electrodes (18, 20) when the electric voltage is applied, and continuing or stopping the test method depending on the second characteristic of the electric arcs (70).

6. The method according to claim 5, wherein the second characteristic is the number of electric arcs (70) observed during a predetermined time period during which the electric voltage is applied.

7. The method according to claim 1, in which the spark plug (10) is a used plug.

* * * * *